United States Patent [19]

Lewis

[11] Patent Number: 4,835,726

[45] Date of Patent: May 30, 1989

[54] APPARATUS FOR ANALOG SIMULATION OF A CIRCUIT

[75] Inventor: David M. Lewis, Toronto, Canada

[73] Assignee: University of Toronto Innovations Foundation, Toronto, Canada

[21] Appl. No.: 878,793

[22] Filed: Jun. 26, 1986

[51] Int. Cl.[4] .......................... G06G 7/62; G06G 7/48
[52] U.S. Cl. ..................................... 364/802; 364/801
[58] Field of Search ................................. 364/800–802, 364/807, 861, 600, 602; 365/129, 167, 244; 357/85

[56] References Cited

U.S. PATENT DOCUMENTS

| | | | |
|---|---|---|---|
| 3,631,232 | 12/1971 | Perreault et al. | 364/802 X |
| 3,775,603 | 11/1973 | Ainsworth | 364/802 X |
| 3,786,242 | 1/1974 | Brooks | 364/802 X |
| 4,354,250 | 10/1982 | Lee | 364/861 X |
| 4,383,305 | 5/1983 | Lee | 364/861 X |
| 4,499,552 | 2/1985 | Kanazawa | 364/802 |
| 4,584,662 | 4/1986 | Lin | 364/802 |

FOREIGN PATENT DOCUMENTS

| | | | |
|---|---|---|---|
| 0794641 | 3/1981 | U.S.S.R. | 364/802 |
| 0928376 | 5/1982 | U.S.S.R. | 364/802 |
| 1088024A | 4/1984 | U.S.S.R. | 364/802 |
| 1126977A | 11/1984 | U.S.S.R. | 364/802 |

OTHER PUBLICATIONS

David M. Lewis, "A Hardware Engine for Analogue Mode Simulation of MOS Digital Circuits", Design Automation Conference, Las Vegas, Nev., Jun. 25, 1985.

Primary Examiner—Gary V. Harkcom

[57] ABSTRACT

An apparatus simulates an electronic circuit having a number of circuit elements, each being coupled to an associated set of nodes, a pair of which are capable of carrying a current therebetween, such as transistors. The apparatus has a selection device to select a circuit element to be simulated. A first memory is coupled with the selection device for storing the characteristics of each of the transistors. A transfer device transfers the characteristics from the first memory to a first register. A second memory stores the voltage present at each of the nodes, while a retrieval device retrieves the nodal voltages from the second memory and transfers them to a second register. Coupled to the first and second registers is a computation unit to ascertain the current flowing between the current carrying nodes and the subsequent change of voltage at those nodes. The apparatus carries out the simulation over a series of incremental time steps thereby providing an analog simulation of the circuit.

9 Claims, 5 Drawing Sheets 4,835,726

APPARATUS FOR ANALOG SIMULATION OF A CIRCUIT

FIELD OF THE INVENTION

The present invention relates to circuit simulation.

BACKGROUND OF THE INVENTION

Fast hardware simulation engines are a recent development in response to the increasing complexity of very large scale integrated (VLSI) circuits, ad provides a much more rapid simulation than the more conventional software packages.

Present hardware simulation engines have a digital modelling scheme and simulate the VLSI circuit as a series of time delay switches, the overall time delay of a particular region in the circuit being a progressive summation of the time delay of each circuit element. Circuits using elements such as transistors have a unique transient response which is dependent on its characteristic and the inherent capacitance in and around the transistors. In circuits which rely on the detailed characteristics of transistors, a switch level simulation may produce an incorrect result. Accordingly it would be desirable to simulate the VLSI circuit in order to obtain not only the correct logical result but also the transient response of the circuit.

Present digital hardware simulation engines, due to their digital simulating technique, do not model transient response due to the necessarily high number of variables and the overly long computational time period.

Therefore, digital hardware simulators are ineffective in modelling transient response, especially in the simulation of low level circuits where the transient response must be calculated in order to simulate the circuit correctly.

SUMMARY OF THE INVENTION

It is therefore an object of the present invention to obviate or mitigate the above-mentioned disadvantages and provide a simple hardware engine utilizing analog simulation techniques.

Broadly stated the invention is an analog simultation apparatus to simulate an electronic circuit having a plurality of circuit elements, each of said circuit elements being coupled to an associated set of nodes in said circuit, said circuit elements being capable of carrying a current along a channel defined between a pair of said nodes of said set, said apparatus comprising:

selection means for selecting a circuit element to be simulated;

a first memory coupled with said selection means for storing the characteristics of each of said plurality of circuit elements, said characteristics including the respective one of said set of nodes and a scaling factor associated with each of said pair of nodes; said first memory being responsive to a first signal to identify the characteristic of said selected circuit element;

means to transfer said characteristics from said first memory to a first register for registering said characteristics of said given circuit element;

a second memory for storing the voltage present at each node in said set of nodes, said second memory being responsive to a second signal to identify the voltage present at each node of said selected circuit element;

means to retrieve from said second memory, the nodal voltages of each of said set of nodes registered in said first register, and transfer said nodal voltages to a second register;

a computation unit coupled with said first and second registers, comprising:

comparing means to compare the voltages present at said pair of nodes, so as to determine the direction of current there-between;

a first subtracting means for determining the voltage difference between said pair of nodes;

a first circuit coupled with said first subtractor to determine the current flowing between said pair of nodes, said current being a function of a set of variables including said voltage difference and the scaling factors of said current carrying nodes;

a second circuit coupled with said first circuit for ascertaining the change of voltage at each of said current carrying nodes, as a function of said current and said associated scaling factor.

In a preferred embodiment, the circuit elements to be simulated are field effect transistors whose set of nodes include a gate node and a pair of current carrying nodes identified as drain and source nodes. The computation unit further comprises an identification means coupled to the output of the comparing means for distinguishing between a p-channel and an n-channel transistor. The second subtracting means determines the voltage difference between said gate and source nodes, and defined as the gate-source voltage. A third subtracting means is coupled with the second subtracting means and the third memory to determine the voltage difference between the gate-source voltage and threshold voltage. The first circuit includes a fourth memory to receive input signals from the first and third subtracting means for identifying values of current stored therein as a variable depending on:

(i) the voltage difference between the gate-source voltage and the threshold voltage, and (ii) the drain source voltage as is defined by the voltage difference between the respective pair of nodes.

A first adder is coupled to the output of the fourth memory for generating the sum of the logarithmic values of the current and the scaling factor for the drain node, the sum being the logarithmic value of the voltage change at the drain node. A first exponential generator receives an input signal from the first adder for determining the voltage change at the drain node. A first switching circuit receives input signals from the first exponential generator comparator and the second register for assigning an additive or subtractive sense to the drain node voltage change, depending on the output of the comparator and for determining the new voltage at the drain node.

A second adder and exponential generator as well as a second switching circuit are coupled in the same fashion as for the drain node for determining the voltage change and the subsequent new voltage at the source node.

BRIEF DESCRIPTION OF THE DRAWINGS

Further features, objects and advantages of the present invention will be evident following the detailed description of a preferred embodiment, given by way of example only, as seen in the appended drawings in which.

DESCRIPTION OF THE PREFERRED EMBODIMENT

Figure 1B:
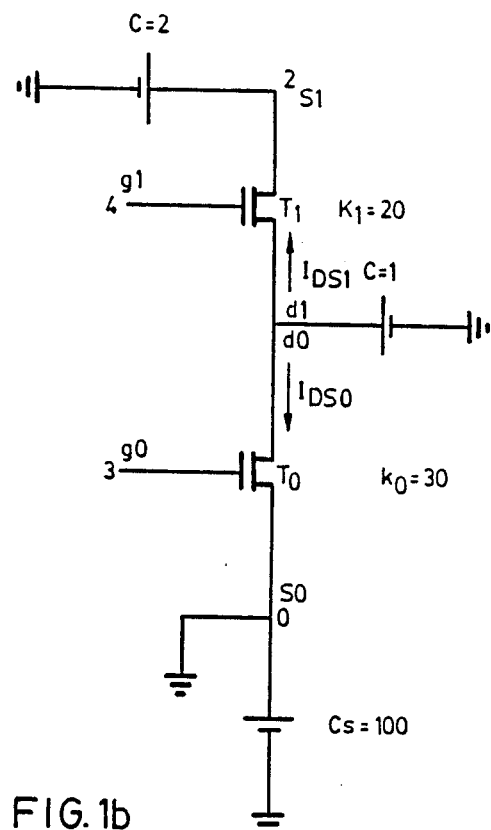
FIGS. 1a and b are schematic views of a circuit element to be simulated and an example circuit comprised of such circuit elements respectively.

In order for the simulation to be implemented, it is necessary to form a model of a typical circuit element on which all characteristics to be considered are identified. A typical and preferred circuit element is an FET transistor, the family of which includes two groups, conventionally identified as the n-channel and p-channel groups. Although several models can be implemented by the present simulation apparatus, a preferred model is demonstrated in FIG. 1a wherein a common FET transistor has the following characteristics each to be described below:
- s = source node
- d = drain node
- g = gate node
- Cd = capacitance of the drain node associated to ground
- Cs = capacitance of the source node associated to ground
- k = characteristic factor of the transistor
- Vds = drain-source voltage
- Vgs = gate-source voltage
- Ids = drain-source current The gate node, g, acts as the activating switch of the transistor. The application of voltage differences between the gate and source nodes and the drain and source nodes, namely Vgs and Vds respectively, causes the current Ids to flow between the current carrying nodes, namely the drain and source nodes d, s respectively. By convention, a positive Vgs applied to an n-channel FET will permit current to flow from the drain node to the source node. In contrast, a negative Vgs applied to a p-channel FET will permit current to flow from the source node to the drain node. However, like any switching mechanism, there is a minimum Vgs necessary in order to cause such a current to flow in either FET transistor type. This is known as the threshold voltage, or more commonly known as the pinch-off voltage, and is identified by the variable Vt.

The current Ids resulting from the application of a gate-source voltage is determined by the following equations:

$$Ids = \frac{k}{2} \times (Vgs - Vt)^2 \text{ when } Vds \; Vgs - Vt \quad (1)$$

$$Ids = k \left( Vgs - Vt - \frac{Vds}{2} \right) \times Vds \text{ when } Vds \; Vgs - Vt \quad (2)$$

As can be seen by the equations (1) and (2), the current Ids is also dependent on the characteristic factor k, which is normally determined by measuring the aspect ratio of the transistor, namely the width divided by the length of the area it occupies on the integrated circuit, while taking into account typical fabrication effects.

The present simulation device reduces the time consuming computation of Ids as shown in the above equation by implementing a rapid determination of Ids by means of a look up table, wherein values of reference current Ids for a transistor having a unit k value are stored according to possible ranges of Vgs and Vds across the transistor. Accordingly, the actual current flowing through the transistor is subsequently determined by adjusting the reference current to take into account the actual k value as follows:

$$Ids = kIds'$$

where $$Ids' = Ids$$

for $$k = 1 \quad (3)$$

In order to take into account the inherent capacitances in the circuit while maintaining a simplified simulation procedure, the circuit element model has a capacitance associated to ground for each of the drain and source nodes, namely Cs and Cd. This enables the accurate modelling of "wiring capacitance" which accounts for the majority of the capacitance seen in the circuit. The values of Cs and Cd can also be adjusted to take into account the inherent capacitance of the transistor.

The values of Ids', k and the nodal capacitance are incorporated into the simulation scheme by the use of The Euler forward integration method with which the voltage change may be determined at either of the drain and source nodes as follows:

$$(\text{delta}) \; V = \frac{k}{C} \; Ids' \; (\text{delta}) \; t \quad (4)$$

or by considering the voltage change after a unit time step of (delta) t:

$$(\text{delta}) \; V_i = \frac{k}{C_i} \; Ids' \text{ where } i = s \text{ or } d \quad (5)$$

Thus, the present circuit simulation device models circuit elements, for example transistors, by considering nodal capacitance associated to ground, a characteristic factor, threshold voltage, and the voltages present at each of the nodes to determine the current Ids' and the associated (delta) V at each of the drain and source nodes after a series of incremental time steps. Moreover, by repeating the simulation over the incremental time steps, a dynamic response may be obtained for each circuit element in a circuit such as that shown in FIG. 1b.

Figure 1A:
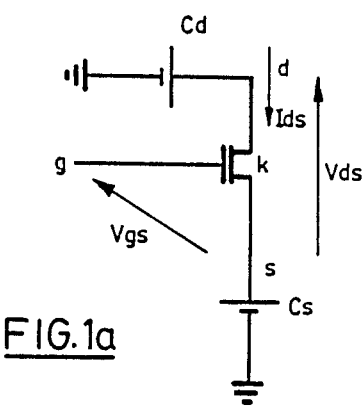

The exemplary circuit shown at FIG. 1(b) has two FET transistors T0, T1 connected in series, each having a unique set of characteristic values and nodes, each of the nodes having a particular voltage difference with respect to ground. It follows then that each transistor will have a unique current flowing from the higher nodel voltage to the lower nodal voltage.

Since the nodal voltages and currents of each transistor are unknown at the onset of the simulation, drain and source nodes are arbitrarily chosen and identified by d0, s0 for T0 and d1, s1 for T1.

It will be noted that node 1 is shared by T0 and T1 and is arbitrarily identified as a drain node for each of T0 and T1. Consequently, after each incremental step the two voltage changes, namely (delta) Vd1 and (delta) Vd0 will appear at node 1 in accordance with the currents Ids1 and Ids0. Thus, the actual nodal voltage change after each time step is the sum of the voltage changes, namely (delta) V1=(delta) Vd0+(delta) Vd1, and is calculated after each incremental step.

Thus, while the nodal currents are determined on the basis of nodal voltage at the beginning of the incremental simulation, nodal voltages are adjusted on the basis of an accumulated nodal voltage at the end of increment of simulation of a previous transistor. Consequently, the present simulation utilizes two tables of nodal voltages, one storing the nodal voltages at the beginning of the simulation, while the other stores nodal voltages which are adjusted at the end of each transistor simulation.

A particular feature of the present simulation technique is the use of look up tables to store circuit information in a readily accessible fashion. One such look up table is shown as Table 1 in FIG. 2 and stores information pertaining to each of the transistors to be simulated as follows:

k/Cs=scaling factor of source node
k/Cd=scaling factor of drain node
g=gate node
s=arbitrarily chosen source node
d=arbitrarily chosen drain node
UPDs=up-date control for source node
UPDd=up-date control for drain node
UPDs1=first update control for source node
UPDd1=first update control for drain node
Tn/p=identification of n or p channel transistor
Ttype=identification of model to be implemented in simulation The update control variables for the source and drain nodes serve as labels in the event that either or both of the arbitrarily chosen source and drain nodes are coupled to a voltage source or common ground. Moreover, the UPDs and UPDd variables control whether or not the source of drain node voltage is updated at the end of the simulation step, as will be explained. The "first" update controls for the source and drain nodes, as will be later described, are indicators to identify whether or not (one or both of) the arbitrarily chosen source and drain nodes have been used in the simulation of a previous transistor. The Tn/p signal indicates the type of transistor being simulated, being either an n-channel or a p-channel type. Finally, the T-type signal governs the selection of the circuit element model to be implemented in the simulation of a particular circuit element.

Another of the look up tables in Table 2 which stores two sets of voltage values at each node in the circuit, namely the voltage values at the "beginning" of a particular time step, and at the "end" of the time step. As will be later explained, the columns "$V_B$" and "$V_E$" switch roles at the end of a particular time step, such that the former "$V_E$" column at T=t becomes the "$V_B$" column at $T=t+1$.

A further look up table, Table 3, stores values of Ids' as a function of Vgs−Vt and Vds, while another look up table, Table 4, stores values of Vt according to the variable Tn/p and a variable "Vrs", as will be described. In this manner, the present simulation technique minimises the amount of computation needed to arrive at the nodal voltages at the end of a particular time step by storing the circuit and transistor characteristics in look up tables which are repeatedly accessed during the simulation, as is shown by the dashed lines in FIG. 2.

Figure 2:
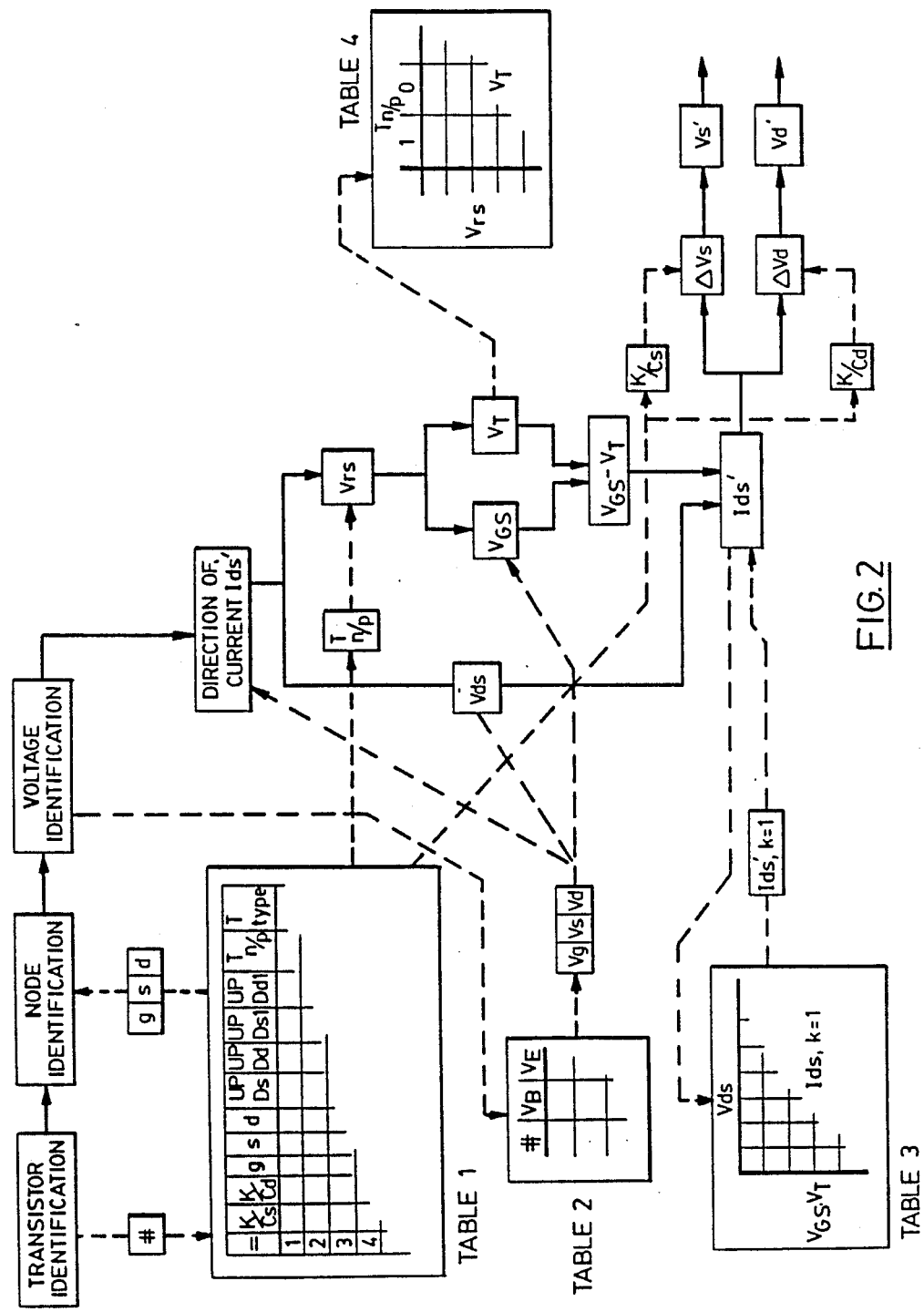
FIG. 2 is a flow diagram indicating the overall scheme of a simulation.

With reference to FIG. 2, the simulation technique is initiated by deciding which transistor is to be simulated. This is done by assigning each of the transistors a number, such that the group of transistors are represented by a series of numbers in numerically ascending order, from the first to be simulated, to the last. Once a particular transistor is identified, Table 1 is accessed to obtain the particular transistor's characteristics, some of which pertain to the location of the particular transistor in the circuit. Being the second step of the technique, this involves the identification of the g, s and d node mapping from Table 1 of the transistor, as well as the characteristics Tn/p, Ttype, log (K/Cs), log (K/Cd), UPDs, UPDd, UPDs1, and UPDd1. In this case K/Cs and K/Cd are stored in logarithmic notation to further simplify the calculation procedure as will be described. With the nodes of the particular transistor known, the voltage at each node is easily and quickly obtained from Table 2.

The direction of current is then determined between the arbitrarily chosen drain and source nodes by identifying the node with the higher voltage, since current will flow from the higher voltage node.

With the direction of current, Ids, obtained the simulation scheme is split into two paths, both of which lead to the determination of Ids'. The first of the paths involves the calculation of Vds, the difference between Vd and Vs.

The second of the paths involves several steps leading to the determination of the variable (Vgs−Vt). The second path initially involves identifying the node acting as the source, that is the real source node and its associated voltage Vrs. This is determined with reference to the direction of Ids' and the type of transistor identified by variable Tn/p. For example, Vrs for an n channel transistor is as follows:

Vrs=Vs, if s is the real source node, or
Vrs=Vd, if d is the real source node

Following the identification of the real source, the values of Vgs and Vt are determined simultaneously using voltage values obtained from Tables 2 and 4 respectively. In this case Vgs is the difference between Vg and Vs while Vt is selected as a function of Vrs and Tn/p.

Using the obtained values of (Vgs−Vt) and Vds, Ids' is determined by accessing Table 3, and is then used in the subsequent step of determining the change of voltage at each of the source and drain nodes, in accordance with equation (5) above.

The final step in the simulation is the adjustment of the drain and source node voltages in accordance with the respective voltage changes at the end of time step.

Figure 3:
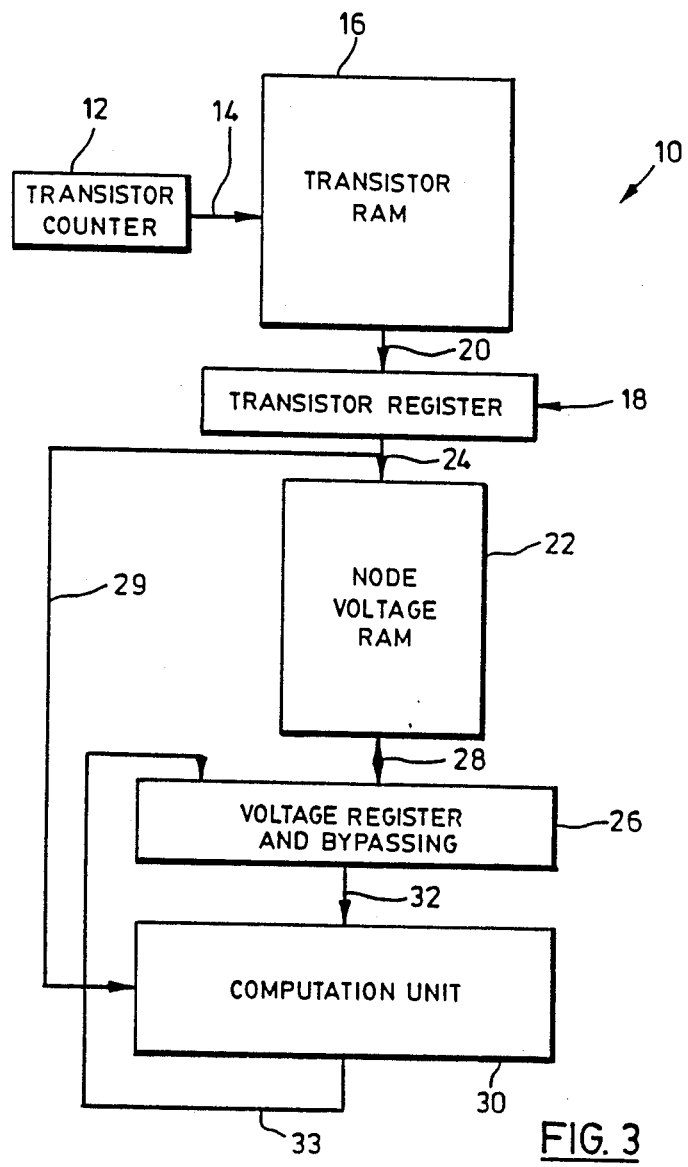
FIG. 3 is a schematic diagram of a simulation apparatus to carry out the simulation of FIG. 2.

The simulation apparatus for carrying out the overall scheme is shown in FIG. 3 by the numeral 10. The simulator 10 has a counter 12 which identifies the transistor to be simulated and conveys a signal via conductor 14 to first memory 16 which stores the characteristics of the transistor to be simulated in accordance with Table 1. These characteristics are conveyed to first register 18 via conductor 20. First register 18 conveys a signal to second memory 22 via conductor 24 for identifying the voltages present at the g, s and d nodes of the transistor, as are found in Table 2. These values are conveyed to second register 26 via conductor 28. Second register 26 conveys via conductor 32, the nodal voltages to computation unit 30 which determines the current Ids', the resulting nodal voltage changes, as well as the nodal voltages at the end of each simulation time step. These computations are also based on the transistor characteristics received on conductor 29, from first register 18, as will be described.

Figure 4:
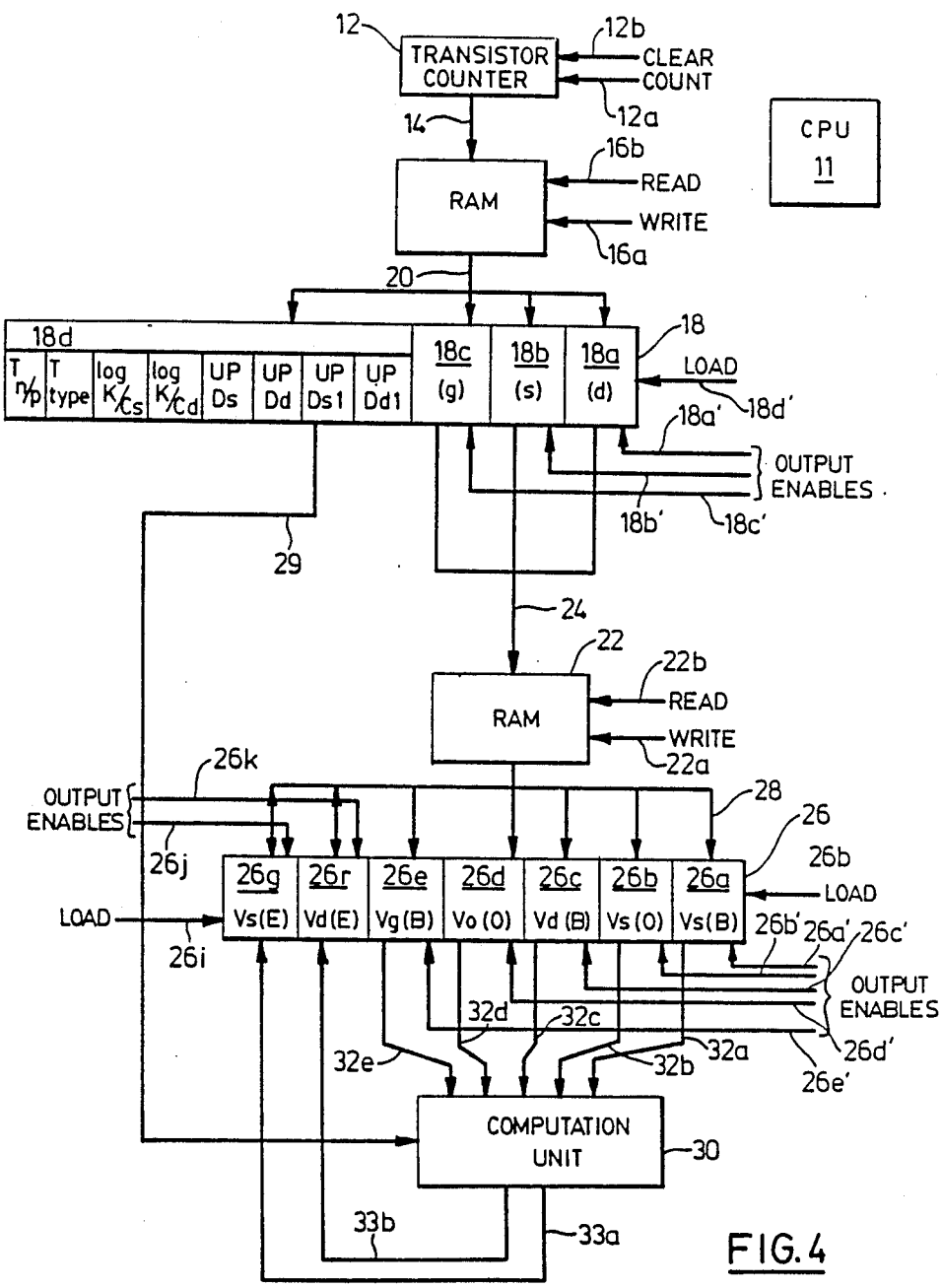
FIG. 4 is a more detailed schematic view of the apparatus.

FIG. 4 illustrates further features of the simulation apparatus 10 including a central processing unit 11 which issues "control" signals to the apparatus components so as to control sequencing. Counter 12 receives a "count" input on control line 12a to advance the transistor count in a particular time step and a "clear" input on control line 12b to reset the transistor count at the end of the time step. First memory 16 is of the RAM type and receives a "write" input on control line 16a enabling transistor identification data to be entered in a particular address, when compiling look up Table 1, and a "read" input on control line 16b to enable transistor characteristics at a particular address to be issued on bus 20.

First register 18 is portioned to provide four fields, three of which, namely 18a to 18c, are assigned to the address of each of the g,s and d nodes. The fourth field 18d is assigned to the remaining characteristics of the identified transistors, namely: Tn/p, Ttype, log (K/Cs), log (K/Cd), UPDs, UPDd, UPDs1, and UPDd1.

First register 18 receives a "load" input on control line 18a' enabling register to load the transistor characteristics on bus 20. First register also receives "output enable" inputs on control lines 18a', 18b' and 18c' which cause first register 18 to issue the address of each of the g,s and d nodes on address bus 24, which are received by second memory 22 storing the voltages at each of the nodes. The transistor characteristics registered in fourth field 18d are conveyed via data bus 29 to computation unit 30. Second memory 22 is also of the RAM type and receives "write" input on control line 22a enabling nodal voltage data to be entered in a particular address and a "read" input on control line 22b to enable the nodal voltages at the particular address to be issued on data bus 28.

Second register 26 receives inputs from the data bus 20 which are directed to various partitioned fields. Four of the fields register Vs and Vd. Fields 26a and c register Vs(B) and Vd(B) respectively, namely the source and drain voltages at the beginning of the time step.

Fields 26b and d register Vs(0) and Vd(0) respectively, which are governed by the following:
(i) At the first time step, Vs(0)=Vs(B), Vd(0)=Vd(B). This is due to the fact that no previous simulations have occured so that the voltage at the end of time step is defaulted to equal the voltage at the beginning of time step.
(ii) at subsequent time steps, V(0)=Vs(E), Vd(0)=Vd(E).

A fifth field 26e register Vg(B), the gate voltage at the beginning of time step.

The register 26 also has sixth field 26f and seventh field 26g to register Vs(E) and Vd(E), the respective source and drain voltages at the end of time step, which are received from the computation unit 30, as will be described. Each of fields 26a to 26e have an associated data bus 32a to 32e in to which second register 26 issues the respective data upon output enable inputs from control line 26a' to 26e'. The data on data buses 32a to 32e is subsequently received by computation unit 30, as will be described. At the end of time step, the computation unit issues outputs on data bus 33a and 33b pertaining to Vs(E) and Vd(E), which are subsequently registered in fields 26f and 26g respectively, upon a "load" signal issued to the second register 26 on control line 26i. The second register also receives "output enable" inputs on control lines 26j and 26k which cause sixth and seventh fields 26f and 26g respectively to issue Vs(E) and Vd(E) on data bus 28 for storage in second memory 22.

Th various elements of the computation unit 30 will now be described with reference to FIG. 5.

Figure 5:
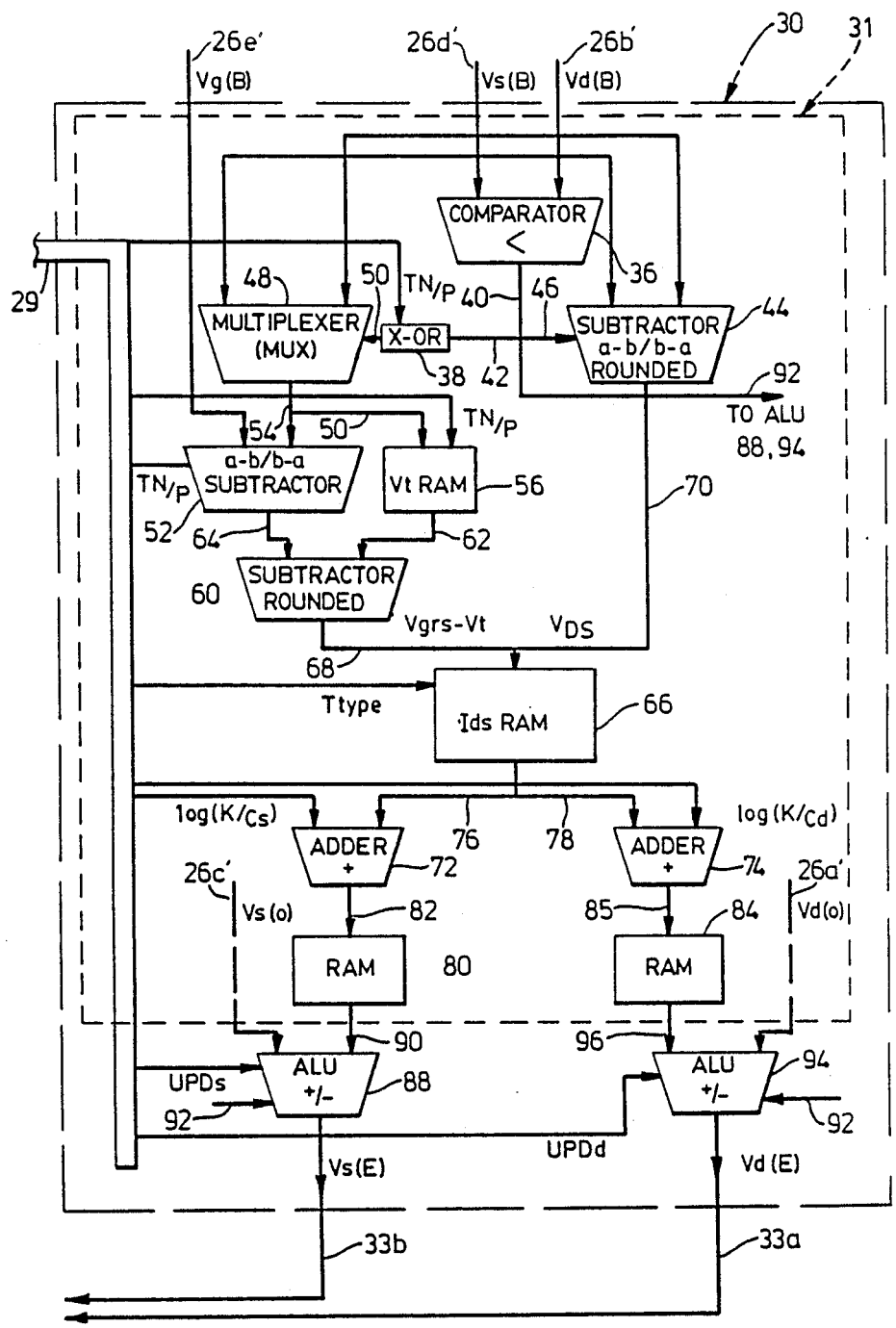
FIG. 5 is a schematic view of one of the components shown in FIG. 3.

The step of determining the direction of current is performed by comparator 36 shown in FIG. 5 which receives Vs(B) and Vd(B) as inputs from data buses 26d' and 26b' respectively. Comparator 36 conveys a "high" or "low" signal, depending on the direction of current, to X-OR gate 38a via conductor 40, 42. X-OR gate 38 also receives a Tn/p input signal from data bus 29 and yields a corresponding "high" or "low" signal, identifying the type or transistor being simulated. The output of comparator 36 is also conveyed to first subtractor 44 via conductor 40, 46, which also receives Vs(B) and Vd(B) inputs from data buses 26d' and 26b' respectively for determining Vds. The output of comparator 36 is also indicative of whether Vds is positive or negative and provides the absolute value of Vds to be generated by first subtractor 44.

The transistor type identification output of X-OR gate 38 is conveyed to multiplexer 48 via conductor 50, multiplexer 48 also receiving Vs(B) and Vd(B) inputs from data buses 26d' and 26b' for identifying the real source voltage, namely Vrs. The output Vrs of multiplexer 48 has a voltage corresponding to Vrs and is conveyed to a second subtractor 52 via conductor 54, the second subtractor 52 also receiving the Vg(B) input from data bus 26c' for determining the gate-real source voltage difference, namely Vgrs. Second subtractor 52 further receives a "high" or "low" Tn/p input signal from databus 29 indicating whether Vg-Vrs or Vrs-Vg is performed in determining Vgrs.

The output Vrs of multiplexer 48 is also conveyed to a third memory 56 via conductor 54, 58, third memory 56 also receiving a Tn/p input signal from databus 29. Third memory 56 stores values of Vt depending on the variables Vrs and Tn/p, which enable third memory 56 to identify a particular Vt. The value of Vt is then conveyed by third memory 56 to a third subtractor 60 via conductor 62 which also receives a Vgrs signal from second subtractor 52 via conductor 64. Third subtractor 60 generates the voltage difference (Vgrs−Vt) which is conveyed to a fourth memory 66 via conductor 68. Fourth memory 66 also receives a Vds signal from first subtractor 44 via conductor 70 and a T-type signal from databus 29. Fourth memory 66 stores the values of Ids as a particular function of the input variables, namely (Vgrs−Vt), Vds, and as a function of the type of transistor being simulated. In other words, fourth memory is partitioned into a predetermined number of sectors, each sector storing values of Ids' dependent on a particular transistor model. In the present case, only one transistor model is being considered, therefore requiring only one sector to be defined in fourth memory 66. Furthermore, the Ids' values are stored in logarithmic notation in order to provide uniform accuracy while reducing the memory size in comparison with linear representation.

The output of fourth memory 66, namely log Ids', is conveyed to adders 72 and 74 via conductors 76 and 78 respectively. Adder 72 also receives an input from second register 26, namely log (k/Cs), and adds the two inputs to generate the logarithmic value of the change of voltage at the source node, namely log (delta) Vs.

Similarly, adder 74 receives an input from second register 26, namely log (k/Cd) and adds the two inputs to generate log (delta) Vd.

The respective outputs of adder 72 and 74 are conveyed to fifth memory 80 via conductor 82 and sixth memory 84 via conductor 85. Fifth memory 80 serves as an exponential generator to produce (delta) Vs in linear representation. Likewise, the output of adder 72 is conveyed to sixth memory 84 via conductor 86 for producing (delta) Vd in linear representation.

The (delta) Vs output of fifth memory 80 is conveyed to arithmetic logic unit 88 (ALU) via conductor 90. ALU 88 also receiving a Vs signal and a UPDs signal from databus 29. In addition, ALU 88 receives a signal from comparator 36 via conductor 40, 92 pertaining to the additive or substractive sense to be assigned to delta Vs as a result of the direction of current Ids. If the UPDs signal indicates that the source node is not connected to a source or commmon ground, ALU 88 produces a signal pertaining to Vs(E) which is conveyed to second register 26 via conductor 33a. Otherwise, if UPDs signal indicates that the S node is connected to a source of ground, then (delta) Vs is disregarded, making Vs(E)=Vs(B).

Likewise, the (delta) Vd output of sixth memory 84 is conveyed to ALU 94 via conductor 96, with ALU 94 issuing a signal pertaining to Vd(E). This value also depends on the direction of current Ids and the UPDd signal and is conveyed to second register 26 via conductor 33b.

Each of the adjusted Vd and Vs values is conveyed by second register 26 to second memory 22 where it is stored. The adjusted voltage at shared nodes, such as node 1 in the example circuit are updated after the simulation of the adjacent transistor and adjusted according to the voltage change generated by the current Ids of the adjacent transistor.

The operation of the analogue simulator is best understood by considering again the example circuit of FIG. 1, containing n-channel transistors to which is assigned the following variables by way of example:

For transistor T0 k0=30
Cs=100
Cd=1

For transistor T1 k1=20
Cs=2
Cd=1

To start the simulation procedure, counter 12 is enabled to identify the first transistor namely T0, after which memory 16 is enabled to access the characteristic values of T0. These are seen in first register 18 as follows:

| Log k/Cs | Log k/Cd | g | s | d | UPDs | UPDd | UPDsl | UPDdl | Tn/p |
|---|---|---|---|---|---|---|---|---|---|
| −.523 | 1.477 | 3 | 0 | 1 | 0 | 1 | 1 | 1 | 1 |

Since the arbitarily chosen source node is connected to a common ground, a logic "low" signal is regsitered in UPDs. The UPDd signal is a logic "high" since the arbitrarily chosen drain node is not connected to a voltage source. The UPDs1 and UPDd1 signals are also logic "highs" since both the arbitrarily chosen source and drain nodes are being updated for the first time. The Tn/p signal is a logic "high" signal indicating that T0 is an n-channel transistor.

With the characteristic values of T0 registered in register 18, controller 11 enables second memory 22 to identify the gate, source and drain voltages. Second memory 22 stores the voltages for each one in the "before" column as follows by example:

TABLE A

|  | B | E |
|---|---|---|
| 0 | 0 | 0 |
| 1 | 3 |  |
| 2 | 5 | 5 |
| 3 | 5 |  |
| 4 | 5 | 5 |

(Thus Vg = 5, Vs = 0 and Vd = 3)

Since T0 is not connected to nodes 0,2 and 4, the voltages of these nodes will not change during the simulation of T0. Accordingly, the voltages for nodes 0,2 and 4 are set by the controller 11 in both the "before" and "end" columns.

The second memory 22 is then enabled by controller 11 to issue the voltages for the gate, source and drain nodes on data bus 28, while second register 26 is enabled to receive the data in fields 26a to e. The second register 26 then issues the voltages on respective data buses 32a to e. The computation unit 30 then makes the necessary calculations to determine the direction of current, to identify the real source ad to perform the various steps leading up to the calculations of delta Vs and delta Vd in the following sequence:

(1) comparator 36 determines the direction of current by comparing the values of Vs and Vd namely Vs=0 and Vd=3. Since Vd is greater than Vs the current is thus flowing from Vd to Vs and conveys a logic "high" signal indicative of current direction to each of first subtractor 44 and multiplier X-OR gate 38.

(2) X-OR gate 38 receives the logic "high" Tn/p signed, thereby identifying an n-channel transistor and conveys such information to the multiplexer 48, in the form of a logic "low" signal.

(3) muultiplexer 48 identifies the real source, which in this case is the arbitrarily chosen source node, that is, Vs=Vrs.

(4) subtractor 52 determines the difference between Vg and Vrs, namely 5−0=5 volts.

(5) simultaneously with step 4, third memory 56 issues the corresponding threshold voltage Vt, namely Vt=0.5 volts (chosen arbitrarily for the present example).

(6) third subtractor 60 determines the difference between Vgrs and Vt, namely 5−0.5=4.5 volts.

(7) simultaneously with steps 3, 4, 5 and 6, first subtractor 44 determines the difference between Vd and Vs, namely Vds=3−0=3 volts.

(8) fourth memory 66 issues the logarithmic value of Ids, namely log Ids' as dependent on the variables (Vgrs−Vt) and Vds, namely, (4.5, 3), Ids' being identified as 0.1 for the present example. Therefore, fourth memory produces log (0.1)=−1.

(9) adder 72 determines the sum, log (k/Cs)+log Ids' namely (0.523)+(−1). Therefore log (delta) Vs=1.523.

(10) Fifth memory 80 determines and exponentiates the value of log (delta) Vs, namely (delta) Vs=0.030.

(11) ALU 88 defaults the (delta) Vs value to zero in accordance with the UPDs signal. Thus, the adjusted value of Vs, namely V's0 remains unchanged at V's0=0.

(12) In equivalent manner and simultaneous to step 9 adder 74 determines log (delta) Vd=0.477 volts.

(13) Simultaneous to step 10, sixth memory 84 determines the value of log (delta) Vd namely (delta) Vd=2.99.

(14) Simultaneous to step 11, ALU 92 assigns a substractive sense to (delta) Vd and determines the adjusted value of Vd, namely V'd0=Vd0−(delta) Vd0=3−2.99=0.01.

(15) The V's0 and V'd0 signals are is transferred to second memory 22 via register 26. Consequently, memory 22 stores the "adjusted" voltages at the end of the transistor T0 simulation in the "end" column as follows:

TABLE B

| | B | E |
|---|---|---|
| 0 | 0 | 0 |
| 1 | 3 | 0.01 |
| 2 | 5 | 5 |
| 3 | 5 | 5 |
| 4 | 5 | 5 |

In subsequent transistor simulation during the first time step, nodal voltages changes are determined on the basis of initial nodal voltages as found in the "before" column, while accumulation of nodal voltage changes are made with reference to the adjusted voltages registered in the "end" column.

With transistor T0 simulated for the first time step, counter 12 identifies transistor T1 the characteristics of which are seen in first register 18 as follows:

| Log K/Cs | Log K/Cd | g | s | d | UPDs | UPDd | UPDsl | UPDdl | Tn/p |
|---|---|---|---|---|---|---|---|---|---|
| 1 | 1.301 | 4 | 2 | 1 | 1 | 1 | 1 | 0 | 1 |

In this instance, the UPDsl signal is a logic "high" since the source node 2 is being updated for the first time. The UPDdl signal, on the other hand, is a logic "low" since the drain node 1 is being updated for the second time. The simulation procedure is now repeated with second memory identifying the nodal voltages from the "Before" column.

Vg1=5
Vs1=5
Vd1=3
Therefore, Vds1=−2

Now, assuming Ids to be 0.3 in this case we find that (delta) Vs=0.5 and (delta) Vd=1.0. The adjusted voltages are then found to be:

V'g1=5
V's1=4
V'd1=2.5

The adjusted voltages for T1 are accordingly substituted in the "End" column as follows:

TABLE C

| | Beginning | End |
|---|---|---|
| 0 | 0 | 0 |
| 1 | 3 | 2.5 |
| 2 | 5 | 4 |
| 3 | 5 | 5 |
| 4 | 5 | 5 |

With the simulation being complete for the first time step, the following steps are performed:

(i) The roles of the "before" and "end" values are reversed, thereby causing the end of time step values to be used as the beginning of time step values for the next time step.

(ii) The counter identifies the first transistor T0 thereby repeating the simulation procedure and advancing the time step by one normalized unit.

It is to be understood that conventional control logic is required to implement the simulation sequence while various data and address buses are needed to carry transistor and nodal information throughout the apparatus. Such features have not been described in detail for the sake of brevity and are considered well known.

Also not shown are the communication channels with central processing unit 11 which accesses the various memories of the circuit for manipulating the simulation data to user readable and analytical form, as it is believed to be well known to those skilled in the art.

The simulation apparatus described herein above is not only capable of simulating VLSI circuits containing FET transistors but also other types including BJT transistors. In the case of BJT transistors, the circuit element is modelled by a combination of an FET transistor with a diode connected across the gate and source nodes.

The present simulation apparatus is also adaptable to simulate resistors in a VLSI circuit and are considered a degenerate form of transistor where k=1/R and Vgs is ignored. In this case, a Ttype signal in fourth memory 66 accesses a specific region therein which stores resistor currents for resistors having k=1 and dependent on the voltage condition across the resistor. This value of current is then adjusted by taking into account the actual resistance present across the terminals of the resistor and the capacitance associated with each terminal.

We claim:

1. A simulation apparatus to perform analog simulations of an electronic circuit having a plurality of circuit elements and a plurality of nodes, each of said circuit elements being coupled to an associated set of said nodes in said circuit, each of said circuit elements being capable of carrying a current between a pair of said nodes of the respective set of nodes, said apparatus comprising:

selection means for sequentially selecting circuit elements of said plurality of circuit elements;

a first memory coupled to said selection means for storing predetermined characteristics of each of said plurality of circuit elements, said characteristics including identification data identifying the respective set of nodes for each circuit element and a scaling factor associated with each node of said pairs of nodes; said first memory comprising means responsive to a first signal to identify the characteristics of the respective selected circuit element;

means for transferring said identified characteristics from said first memory to said first register for registering therein said characteristics of the respective selected circuit element;

a second memory for storing the voltage present at each node of said plurality of nodes, said second memory comprising means responsive to a second signal and said identification data to identify the voltage present at each node of the respective selected circuit element;

means for retrieving, from said second memory, the nodal voltages of each of said set of nodes stored in said first register, and a second register connected to receive said retrieved nodal voltages;

a computation unit coupled to said first and second registers, comprising:

comparing means for comparing the voltages present at the respective said pair of nodes, so as to determine the direction of current therebetween;

a first subtracting means for determining the voltage difference between said pair of nodes;

a first circuit coupled to said first subtracting means to determined the current flowing being said pair of nodes, said current being a function of a set of variables including said voltage difference and the scaling factors of said current carrying nodes;

a second circuit coupled to said first circuit for ascertaining the change of voltage at each of said current carrying nodes, as a function of said current and said associated scaling factor; and a source of said first and second signals.

2. A simulation apparatus as defined in claim 1 wherein said circuit elements are transistors, said set of nodes including an enabling node to control current between said pair of nodes.

3. An analog simulation apparatus as defined in claim 2 wherein said computation unit further comprises identification means coupled to the output of said comparing means for identifiying the type of transistor being simulated.

4. A simulation apparatus as defined in claim 2, wherein said computation unit further comprises a third circuit coupled with said identification means to determine the voltage difference between said enabling node and a reference node, defined by one of said current carrying nodes, and the threshold voltage between said enabling node and said reference node.

5. A simulation apparatus as defined in claim 4 wherein said computation unit includes:

a third memory for storing values of threshold voltage for a set of transistors, of which said transistor to be simulated is a member.

6. A simulation apparatus as defined in claim 5 wherein said plurality of circuit elements includes field effect transistors, said current carrying nodes being defined by drain and source nodes and said enabling node being defined by a gate node, said voltage between said pair of nodes defining the drain source voltage, said computation unit including:

a second subtracting means to determine the voltage difference between said gate and source nodes and defined as the gate-source voltage, third subtracting means coupled with said second subtracting means and said third memory to determine the voltage difference between said gate source voltage and said threshold voltage, said first circuit including a fourth memory to receive input signals from said first and third subtracting means for identifying values of current stored therein as a variable depending on:
(i) the voltage difference between said gate-source voltage and said threshold voltage and
(ii) the drain-source voltage.

7. A simulation apparatus as defined in claim 6 wherein said computation unit includes a first adding means coupled to the output of said fourth memory and said first register to receive respectively in logarithmic form, said current and scaling factor for said drain node, so as to generate the sum of the logarithmic values of said current and said scaling factor and thereby yield the logarithmic value of said voltage change at said drain node.

8. The simulation apparatus of claim 1 wherein said first memory comprises a first addressable list of characteristics, each entry of said list including physical characteristics of a separate said circuit element and said identification data uniquely identifying the nodes to which the respective circuit element is connected, and said selection means comprises a counter connected to sequentially address said entries of said list.

9. The simulation apparatus of claim 8 wherein said second memory comprises a second addressable list correlating the voltages at each node of said plurality of nodes with the identification data uniquely identifying the respective node, said means responsive to a second signal and said identification data comprising means responsive to the identifying data of a given entry of said first addressable list for addressing the corresponding entries of said second memory for retrieval by said retrieving means.

* * * * *